United States Patent [19]

Shirai et al.

[11] Patent Number: 5,683,506
[45] Date of Patent: Nov. 4, 1997

[54] METHOD OF MANUFACTURING A BISMUTH-SUBSTITUTED RARE EARTH IRON GARNET SINGLE CRYSTAL FILM FOR SHORT WAVELENGTH

[75] Inventors: Kazushi Shirai; Norio Takeda, both of Tokyo, Japan

[73] Assignee: Mitsubishi Gas Chemical Company, Inc., Tokyo, Japan

[21] Appl. No.: 664,416

[22] Filed: Jun. 17, 1996

[30] Foreign Application Priority Data

Jun. 16, 1995 [JP] Japan .................. 7-150305

[51] Int. Cl.⁶ ............................................ C30B 19/04
[52] U.S. Cl. ........................... 117/54; 117/58; 117/59
[58] Field of Search ................................ 117/54, 58, 59; 204/192.32

[56] References Cited

U.S. PATENT DOCUMENTS

| | | | |
|---|---|---|---|
| 4,082,424 | 4/1978 | Sauter et al. | 385/6 |
| 4,148,556 | 4/1979 | Sauter et al. | 385/6 |
| 5,512,193 | 4/1996 | Shirai et al. | 252/62.57 |
| 5,535,046 | 7/1996 | Shirai et al. | 359/281 |
| 5,565,131 | 10/1996 | Shirai et al. | 117/937 |

FOREIGN PATENT DOCUMENTS

4338200A2   11/1992   Japan .

*Primary Examiner*—Felisa Garrett
*Attorney, Agent, or Firm*—Sughrue, Mion, Zinn, Macpeak & Seas, PLLC

[57] ABSTRACT

A method of manufacturing a bismuth-substituted rare-earth iron garnet single crystal film used for short wavelengths, includes the steps of: manufacturing a BIG-grown substrate in an LPE furnace by the LPE method, the BIG-grown substrate having a bismuth-substituted rare-earth iron garnet single crystal film grown on one surface of a non-magnetic garnet single crystal substrate, the film having a thickness in the range of 20–100 μm; spinning the BIG-grown substrate at a high speed to remove a melt adhering thereto prior to taking the BIG-grown substrate out of the LPE furnace; and cooling the BIG-grown substrate to 300° C. within one minute.

9 Claims, 2 Drawing Sheets

METHOD OF MANUFACTURING A BISMUTH-SUBSTITUTED RARE EARTH IRON GARNET SINGLE CRYSTAL FILM FOR SHORT WAVELENGTH

BACKGROUND OF THE INVENTION

The present invention relates to a bismuth-substituted rare-earth iron garnet single crystal used as a Faraday rotator for use in magnetooptic sensors and optical isolators, and more particularly to a method of manufacturing a bismuth-substituted rare-earth iron garnet single crystal film used for manufacturing a Faraday rotator having a thickness less than 100 μm.

Recently, optical fiber communication and optical instrumentation have made remarkable progress. Semiconductor lasers are widely used as a signal source in the optical fiber communication and optical instrumentation. However, semiconductor lasers are disadvantageous in that oscillation becomes unstable due to so-called reflected light return where light is reflected by, for example, the end of the optical fiber back to the semiconductor laser. In order to solve this drawback, an optical isolator is provided on the light-exiting side of the semiconductor laser, blocking the reflected light return to stabilize oscillation.

Lasers oscillate at a variety of wavelengths. Long distance optical fiber communication uses wavelengths such as 1.31 μm band and 1.55 μm band, referred to as the long wavelength band in which silica glass exhibits relatively small loss. In contrast, short distance optical fiber communication and optical instrumentation use primarily 0.8 μm band referred to as the short wavelength band for which inexpensive and high output semiconductor lasers are readily available. Therefore, there are two major types of optical isolator, the first is for long wavelength bands such as 1.31 μm and 1.55 μm bands and the second is for a short wavelength band of 0.8 μm.

An optical isolator includes a polarizer, analyzer, Faraday rotator, and permanent magnet for causing the Faraday rotator to magnetically saturate. The Faraday rotator plays a major role in the optical isolator and is usually formed of a bismuth-substituted rare-earth iron garnet single crystal film (referred to as BIG hereinafter) having a thickness in the rage from several tens to 400 μm, grown by the liquid-phase epitaxial method (referred to as LPE method herein after). Such BIGs include $(HoTbBi)_3Fe_5O_{12}$, $(YbTbBi)_3Fe_5O_{12}$, and $(LuTbBi)_3Fe_5O_{12}$.

Growing a BIG by the LPE method is usually carried out as follows: A crucible made of a precious metal is placed in the middle of an LPE apparatus in the form of a vertical furnace. An oxide such as ferric oxide and rare-earth oxide for producing a rare-earth iron garnet is prepared in the crucible together with flux compositions containing lead oxide, boron oxide, and bismuth oxide. These oxides are dissolved at an elevated temperature of about 1000° C. to prepare a melt for growing a BIG.

Then, the temperature of the melt is decreased to about 800° C. to maintain the melt at supersaturation.

A non-magnetic garnet substrate fixedly held by a substrate holder is descended from above the LPE furnace into the LPE furnace till the non-garnet substrate contacts the melt. The substrate in contact with the melt is then rotated for epitaxial growth of a BIG on the substrate. When the BIG has grown to have a predetermined thickness, the substrate is lifted several centimeters above the melt and is then spun at a high speed in order that most of the melt adhering to the substrate leaves the substrate by centrifugal force. Then, the substrate is raised from the melt and is taken out of the LPE furnace.

A problem with the aforementioned prior art method is that the garnet substrate (referred to as BIG-grown substrate herein after) on which a BIG has grown breaks, as shown in FIG. 1, upon taking the garnet substrate out of the LPE furnace which is maintained at 700°–800° C.

The inventors of the present invention developed a measure for preventing the BIG-grown substrate from breaking, where another heating apparatus, i.e., annealing furnace is provided over the LPE furnace so that the BIG-grown substrate is accommodated in the annealing furnace (which has been heated to 400° to 500° C.) after a BIG has been grown on the substrate, and then the BIG-grown substrate in the annealing furnace is slowly cooled to room temperature.

The BIG-grown substrate taken out of the annealing furnace undergoes acid wash where melt compositions deposited in solid form on the substrate are dissolved and removed. Then, the BIG-grown substrate is polished to a thickness at which a Faraday rotation is 45 degrees. If a BIG to be used as a Faraday rotator is rather thick, it is usual that the non-magnetic garnet substrate is completely removed by polishing. This is done in order to prevent Fresnel reflection (approximately 1.4%) from occurring the interface between the non-magnetic garnet substrate and the BIG, thereby providing a Faraday rotator having as high transmittance as possible for use in optical isolators. If a BIG having a thickness less than 100 μm is to be used as a Faraday rotator, the substrate is usually not removed since mechanical strength of the BIG is insufficient without the substrate.

Some amount of the melt is left on the crystal surface after high speed rotation of the substrate since the melt has a high viscosity. The melt left on the crystal surface solidifies and shrinks while at the same time the crystal surface also shrinks resulting in cracks in some areas as shown in FIG. 2 in which optical properties are poor. Therefore, it is difficult to fulfill optical requirements over the entire crystal surface of the BIG. Thus, the surface of the BIG also needs to be polished to remove defective parts. Such areas having poor optical properties resulting from solidification of the melt are referred to as "melt damage" in this specification. In some cases, foreign matters as shown in FIG. 3 appear on the substrate. These foreign matters seem to be different crystals from BIG, grown from the melt. The melt damages and foreign matters are sources of both light insertion loss and deteriorated extinction ratio, and needs to be removed. Thus, polishing of the BIG surface is also essential.

Faraday rotators formed of a BIG can be polished with a thickness accuracy of about ±2 μm. This corresponds to an Faraday rotation of 45±0.4 degrees at a wavelength 1.31 μm and 45±0.3 degrees at a wavelength 1.55 μm for $(HoTbBi)_3Fe_5O_{12}$. This is within an accuracy of 45±2 degrees required of a Faraday rotator for use in optical isolators. Thus, such Faraday rotators can be used.

However, an accuracy of polishing of ±2 μm is large enough to adversely affect the accuracy of angle of rotation for a faraday rotator having a film thickness less than 100 μm and having the non-magnetic garnet substrate unremoved.

For example, a 2-inch substrate of $(CaGd)_3(MgZrGa)_5O_{12}$ has a thickness accuracy of about ±5 μm. If a BIG grown on this substrate is polished with a total thickness (substrate plus BIG) accuracy of ±2 μm, the thickness of the BIG itself is within an accuracy of ±7 μm. This is due to the fact that the non-magnetic garnet substrates have significantly large variations (±5 μm) in thickness compared to the total polishing accuracy of ±2 μm.

Moreover, it is a wavelength of 0.8 μm band, i.e., short wavelength region, in which the BIG is used with the substrate unremoved, and the angle of rotation per unit film thickness is very large. Therefore, the variation in angle of rotation is several times larger at 0.8 μm band in the short wavelength band than at 1.31 μm and 1.55 μm bands in the long wavelength band. For example, $(HoTbBi)_3Fe_5O_{12}$ has a coefficient of Faraday rotation of about one degree per micron of thickness thickness at a wavelength of 0.78 μm. Therefore, a polishing accuracy of ±7 μm corresponds to an angle of rotation accuracy of 45±7 degrees. This implies that it is necessary to select Faraday rotators having an angle of rotation of 45±2 degrees from BIGs having a total thickness with an accuracy of ±7 μm. In other words, a problem encountered in the manufacture of Faraday rotators having a film thickness less than 100 μm is that a large number of Faraday rotators are defective in terms of angle of rotation. This very poor yield of products is a problem in manufacturing Faraday rotators on a commercial basis.

SUMMARY OF THE INVENTION

The inventors have made efforts in order to solve the aforementioned poor yield encountered in manufacturing BIGs used as a Faraday rotator having a film thickness less than 100 μm.

The investigation revealed that melt damages and foreign matters are greatly suppressed by rapidly cooling the BIG-grown substrate when the BIG-grown substrate is taken out of the LPE furnace.

Rapidly cooling the BIG-grown substrate eliminates the need for polishing the BIG surface to remove melt damages and foreign matters, allowing using of the unpolished BIG grown by the LPE method to manufacture Faraday rotators. The thickness of the BIG can be closely controlled by adjusting the time length for which the BIG is grown on the non-magnetic garnet substrate by the LPE method. In addition, the investigation also revealed that the surface of the BIG is very smooth and flat after the solidified melt deposited on the surface of the BIG has been dissolved and removed.

The present invention provides a method of manufacturing a bismuth-substituted rare-earth iron garnet single crystal film used for short wavelengths, comprising the steps of:

manufacturing a BIG-grown substrate in an LPE furnace by the LPE method, the BIG-grown substrate having a bismuth-substituted rare-earth iron garnet single crystal film grown on one surface of a non-magnetic garnet single crystal substrate, the film having thicknesses in the range of 20–100 μm;

spinning the BIG-grown substrate at a high speed of, for example, 300 r.p.m. to remove a melt from the BIG-grown substrate by centrifugal force prior to taking the BIG-grown substrate out of the LPE furnace; and cooling the BIG-grown substrate to 300° C. within one minute.

DETAILED DESCRIPTION OF THE PREFERRED EMBODIMENTS

Figure 4:
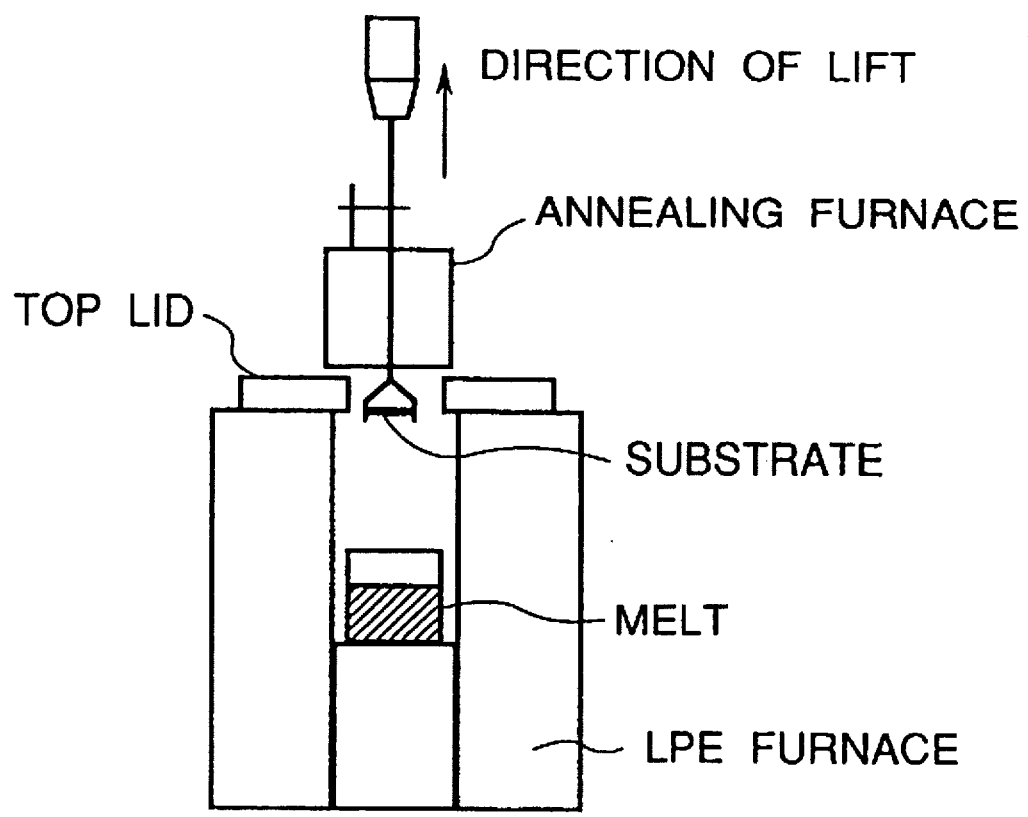
FIG. 4 illustrates an LPE furnace and an annealing furnace placed over the LPE furnace which are used in the present invention.

The present invention will now be described in detail. As mentioned above, in order to prevent the BIG-grown substrate from being cracked when the BIG-grown substrate is taken out of the LPE furnace, it is usually necessary that the substrate is lifted from the LPE furnace and is then temporarily accommodated in the annealing furnace provided over the LPE furnace so the substrate slowly cools to room temperature as shown in FIG. 4.

During this process, the melt solidifies and shrinks causing cracks in the BIG referred to as melt-damages, and development of foreign matters which appear to be fine crystals. The melt-damages and foreign matters decrease if the BIG-grown substrate is quickly taken out of the LPE furnace and is allowed to stand in the air to cool, disregarding the occurrence of cracks in the substrate. In this case, the BIG-grown substrate cools to a temperature close to room temperature in about 30 seconds. Although the BIG-grown substrate is broken into several pieces, quickly cooling the BIG-grown substrate leads to a higher yield of Faraday rotators than polishing the surface of the BIG (Example 3, and Comparison 1).

It is not thoroughly known to the inventors why rapidly cooling the BIG-grown substrate suppresses melt-damages and foreign matters, but the inventors assume as follows:

(1) The grain boundaries of the solidified melt are very fine and therefore the shrinkage of the solidified melt during solidification of the melt does not seriously affect the BIG.

(2) The BIG-grown substrate cools faster than the foreign matters grow.

When the BIG-grown substrate is subjected to rapid cooling, the interior temperature of the BIG does not fall fast enough for fine grain boundaries to be sufficiently developed if the melt solidified on the BIG surface is thick. It is therefore preferable that the BIG-grown substrate is rotated to remove the melt from the BIG surface by centrifugal force so that the thickness of the melt solidified on the BIG surface does not exceed 50 μm, and is then subjected to rapid cooling.

Another investigation revealed that the BIG has a very smooth, flat surface after dissolution and removal of the melt solidified on the BIG surface (Example 1).

It is significant that in the method of manufacturing of a BIG, the present invention can produce a high yield of Faraday rotators without a need for a polishing process.

Figure 1:
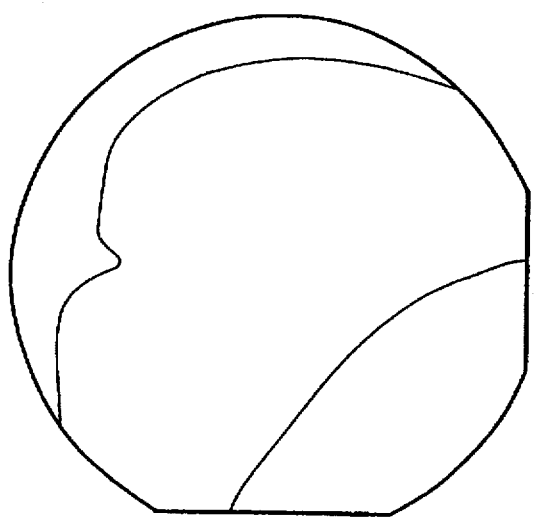
FIG. 1 illustrates a BIG-grown substrate which breaks when quickly taken out of the LPE furnace.
Figure 2:
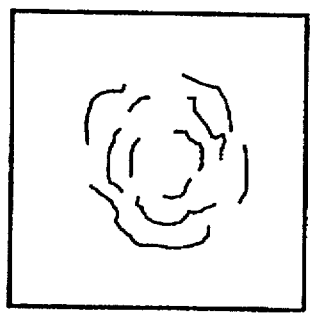
FIG. 2 illustrates cracks developed in some areas of the substrate.
Figure 3:
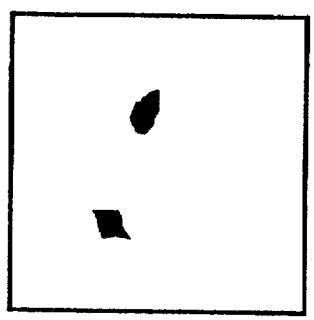
FIG. 3 illustrates foreign matters developed on the substrate.

The present invention further provides an improved yield of BIGs by selecting the cooling speed of the BIG-grown substrate, or rapidly cooling the BIG-grown substrate and the lower limit of the temperature in the rapid cooling. That is, when a 2-inch size BIG-grown substrate is taken from the LPE furnace directly into the air, the substrate cools to a temperature close to room temperature in about 30 seconds with the result that the substrate are broken into at least three pieces (FIG. 1 and Example 3).

However, most of the BIG-grown substrates can be taken out without breakage by first lifting the BIG-growing substrate from the crucible, then temporarily accommodating the BIG-grown substrate in the annealing furnace provided over the LPE furnace, and finally taking the BIG-grown substrate out of the annealing furnace. Even if the BIG-grown substrates break, they do not break into many pieces but, for example, only two pieces, minimizing decrease in the yield of BIG.

The temperature of the annealing furnace is preferably 100° to 250° C. Temperatures above 300° C. prevents the breakage of the BIG-substrate but decreases the speed at which the melt adhering to the BIG surface solidifies, causing more melt-damages and foreign matters to develop.

The result is a low yield of BIGs. When a BIG-grown substrate is to be accommodated in the annealing furnace, it is necessary to take into account that the actual furnace temperature is different from the setting temperature. This is due to the fact that when the top lid of the LPE furnace is opened prior to taking the BIG-grown substrate from the LPE furnace, the heat radiation and ascending air flows from the LPE furnace into the annealing furnace increase the temperature of the annealing furnace. For example, when the annealing furnace was set to 200° C., the temperature of the annealing furnace instantly increased to a value higher than 300° C. immediately after the top lid of the LPE furnace was opened. Thus, the setting temperature of the annealing furnace must be determined taking into account the heat radiation and air flow ascending from the LPE furnace (Comparison 3).

The BIG-grown substrate quickly taken from the LPE furnace has a layer of solidified melt thereon and cannot be directly used to manufacture Faraday rotators. The solidified melt can be effectively removed by immersing the BIG-grown substrate in an acid and washing it by ultrasonic cleaning with the BIG-grown substrate immersed in the acid. It is required that the acid attacks the BIG-grown substrate more quickly to dissolve the solidified melt than to dissolve the BIG. If the BIG is dissolved by several microns, many etch pits will appear on the surface of the BIG resulting in a rough BIG surface.

In this respect, hydrochloric acid, nitric acid, or a water solution of the mixture of these acids is a suitable cleaning liquid. Sulfuric acid and phosphoric acid are not suitable since the solidified melt is dissolved too slowly by these acids. The temperature of the cleaning liquid is preferably below 50° C. The temperature of the cleaning liquid higher than 50° C. is not suitable since the cleaning liquid attacks the BIG to dissolve by several microns before the solidified melt is completely dissolved, resulting in many etch pits in the surface of the BIG. A layer of solidified melt having a thickness larger than 100 μm takes too long a time to be dissolved, resulting in similar etch pits in the surface of the BIG.

The invention will now be described in detail by way of specific examples and advantages thereof. The examples are only exemplary and do not limit the scope of the invention.

EXAMPLE 1

A $(HoTbBi)_3Fe_5O_{12}$ single crystal film for manufacturing a Faraday rotator having a thickness of 0.78 μm was manufactured by the LPE method as follows: The LPE furnace takes the form of a vertical furnace having an inner diameter of 22 cm and a height of 100 cm, and has a 6-cm thick top lid made of a refractory material. An annealing furnace having a 30-cm inner diameter, 40-cm outer diameter, and 40-cm height is provided two centimeters above the top lid. The annealing furnace can be opened vertically into two parts.

Two thousand seven hundred grams of lead oxide (PbO, 4N), 2,400 grams of bismuth oxide ($Bi_2O_3$, 4N), 340 grams of ferric oxide ($Fe_2O_3$, 4N), 120 grams of boron oxide ($B_2O_3$, 5N), 17 grams of terbium oxide ($Tb_4O_7$, 3N), and 23 grams of holmium oxide ($Ho_2O_3$, 3N) were put in a platinum crucible of 1500 ml capacity placed substantially in the middle of the LPE furnace. These oxides were heated to 1,000° C. to dissolve and the dissolved content in the crucible was stirred sufficiently for homogeneous condition. Then, the content in the crucible was cooled to 768° C., thereby preparing a melt for growing a bismuth-substituted rare-earth iron garnet single crystal. Then, a 500 μm thick 2-inch (111) garnet single crystal substrate having a lattice constant of 12.497±0.002 angstroms was suspended with its lower side in contact with the surface of the melt. The melt was maintained at 768° C. and the substrate was rotated at a speed of 60 r.p.m. for 75 minutes to carry out epitaxial growth.

After completion of epitaxial growth, the substrate was raised by 1 cm from the surface of the melt and is then rotated at a speed of 300 r.p.m. for one minute to spin-remove the melt adhering to the surface of the bismuth-substituted iron garnet single crystal.

Upon completion of the spin-removal of the melt, the top lid of the LPE furnace was opened and the substrate was lifted upward from the LPE furnace into the annealing furnace. The annealing furnace was not heated at all but the furnace temperature increased to 220° C. due to the heat radiation and air flow ascending from the LPE furnace into the annealing furnace when the top lid of the LPE furnace was opened. It took five seconds from raising the substrate from the melt surface till the substrate was accommodated in the annealing furnace.

As soon as the substrate has been accommodated in the annealing furnace, the top lid of the LPE furnace was quickly closed, and the annealing furnace was opened ten seconds after. After having been cooled to a temperature close to room temperature, the BIG-grown substrate was taken out of the annealing furnace and was immersed in a 10% water solution of hydrochloric acid with the BIG-grown substrate held by the substrate holder made of platinum. Then, the BIG-grown substrate was subjected to the ultrasonic cleaning with the BIG-grown substrate immersed in the water solution of hydrochloric acid.

Upon dismounting the BIG-grown substrate from the holder, the BIG-grown substrate was found to have broken into two substantially equal parts.

The angle of rotation measured at arbitrary four points on the BIG-grown substrate was in the rage from 42.1 to 42.5 degrees.

Another epitaxial growth was carried out in order to achieve an angle of rotation of 45 degrees. The melt was replenished with garnet compositions and crystal growth was carried out by the LPE method for 80 minutes (=75×(45 divided by 42.3)) while maintaining the other conditions the same as the previous epitaxial growth. Specifically, the melt was replenished with 0.25 grams of ferric oxide ($Fe_2O_3$, 4N), 0.078 grams of terbium oxide ($Tb_4O_7$, 3N), and 0.13 grams of holmium oxide ($Ho_2O_3$, 3N), and was heated to 1,000° C. to dissolve and stirred sufficiently for homogeneous condition.

The substance on which a BIG was grown by the LPE method for 80 minutes was scribed into individual elements of a 5 mm by 5 mm size. Fifty-one elements were completely shaped to be a 5 mm by 5 mm size. The fifty-one elements were observed under a microscope to inspect the BIG, and elements having melt-damages and/or foreign matters within a 4-mm effective aperture were rejected as defective ones. Six elements were found defective. Then, 45 good elements were measured to determine their angles of rotation at a wavelength of 0.78 μm. The angles of rotation were in the range from 44.6 to 45.2 degrees.

EXAMPLE 2

A 48-μm thick $(HoTbBi)_3Fe_5O_{12}$ single crystal film was manufactured with the same conditions as in Example 1 (LPE growth for 80 min.) except that the time from spin-removal of the melt till the BIG-grown substrate is accommodated in the annealing furnace was 30 seconds. The BIG-grown substrate was subsequently processed in exactly the same way as in Example 1, and 56 Faraday rotators of a 5 mm by 5 mm size were obtained, of which 13 Faraday rotators were rejected since they had melt damages and/or foreign matters within their effective apertures. Then, 43 good elements were measured to determine their angles of rotation at a wavelength of 0.78 μm. The angles of rotation were in the range from 44.7 to 45.7 degrees.

EXAMPLE 3

A 48-μm thick $(HoTbBi)_3Fe_5O_{12}$ single crystal film was manufactured with exactly the same conditions as in Example 1 (LPE growth for 80 min.) except that the annealing furnace was not used and the BIG-grown substrate was lifted from the LPE furnace directly into the air. The BIG-grown substrate was raised from the melt to a height of 60 cm above the top lid in five seconds. In this case, the BIG-grown substrate broke into three pieces. The BIG-grown substrate was subsequently processed in exactly the same way as in Example 1 and 39 Faraday rotators of a 5 mm by 5 mm size were obtained, of which three rotators were rejected since they contained melt damages and/or foreign matters within the effective aperture. Then, 36 good elements were measured to determine their angle of rotation at a wavelength of 0.78 μm. The angles of rotation were in the range from 44.9 to 45.5 degrees.

COMPARISON 1

A 98-μm thick $(HoTbBi)_3Fe_5O_{12}$ single crystal film was manufactured with exactly the same conditions as in Example 1 except that the LPE growth was carried out for 150 minutes. The annealing furnace had been heated to 500° C. before the BIG-grown substrate was lifted from the LPE furnace into the annealing furnace. After the BIG-grown substrate was accommodated in the annealing furnace, the annealing furnace was cooled at a rate of 150° C. per hour and the BIG-grown substrate was taken out when the annealing furnace reached about 60° C.

The melt deposited on the BIG surface was removed in the same way as in Example 1. The BIG was then polished so that an angle of rotation of 45 degrees was achieved at a wavelength of 0.78 μm. After completion of polishing, the substrate was scribed into 65 elements each of which has a size of 5 mm by 5 mm. The angles of rotation of 65 elements were measured, of which 15 elements had angles of rotation less than 43 degrees and 17 elements in the range of 43–47 degrees, and 32 elements more than 47 degrees.

COMPARISON 2

A 47-μm thick $(HoTbBi)_3Fe_5O_{12}$ single crystal film was manufactured with exactly the same condition as in Example 1 (LPE growth for 80 min.). The BIG-grown substrate was subsequently processed in exactly the same way as in Example 1, and 64 Faraday rotators having a 5 mm by 5 mm size were obtained, of which 60 Faraday rotators were rejected since they had melt damages and/or foreign matters within their effective aperture.

COMPARISON 3

A 48-μm thick $(HoTbBi)_3Fe_5O_{12}$ single crystal film was manufactured with exactly the same conditions as in Example 1 (LPE growth for 80 min.) except that the annealing furnace had been heated to 300° C. before the BIG-grown substrate was accommodated therein. The temperature in the annealing furnace increased to 430° C. as soon as the top lid of the LPE furnace was opened when the substrate was lifted upward from the melt. The BIG-grown substrate was subsequently processed in exactly the same way as in Example 1, and 64 Faraday rotators having a size of 5 mm by 5 mm were obtained, of which 49 Faraday rotators were rejected since they had melt damages and/or foreign matters within the effective aperture.

What is claimed is:

1. A method of manufacturing a bismuth-substituted rare-earth iron garnet single crystal film used for short wavelengths, comprising the steps of:

manufacturing a BIG-grown substrate in an LPE furnace by an LPE method, said BIG-grown substrate having a bismuth-substituted rare-earth iron garnet single crystal film grown on one surface of a non-magnetic garnet single crystal substrate, said film having a thickness less than 100 μm;

spinning said BIG-grown substrate to remove a melt adhering thereto prior to taking said BIG-grown substrate out of the LPE furnace; and cooling said BIG-grown substrate to a temperature below 300° C. within one minute after spinning said BIG-substrate to remove the melt.

2. The method according to claim 1, wherein said LPE furnace is a vertical furnace having a top lid through which said BIG-grown is taken out, and said step of cooling said BIG-grown substrate includes the steps of:

providing an annealing furnace over said top lid in proximity to said lid; and taking said BIG-grown substrate upward from the LPE furnace into said annealing furnace, said BIG-grown substrate cooling in an atmosphere of 100°–250° C. in said annealing furnace.

3. The method according to claim 1, wherein said BIG-grown substrate has a solidified melt deposited on the surface of said a bismuth-substituted rare-earth iron garnet single crystal film after the step of spinning said BIG-grown substrate, said solidified melt having a maximum thickness less than 50 μm.

4. The method according to claim 1, further including the step of:

immersing, after the step of cooling, said BIG-grown substrate in an acid or a water solution of acids to dissolve and remove a solidified layer of the melt deposited on said BIG-grown substrate, said acid or said water solution of acids being below 50° C.

5. The method according to claim 4, wherein said acid is hydrochloric acid.

6. The method according to claim 4, wherein said acid is nitric acid.

7. The method according to claim 4, wherein said water solution of acids is an about 10% water solution of a mixture of hydrochloric acid and nitric acid.

8. The method according to claim 4, wherein said step of immersing further includes the step of:

subjecting said BIG-grown substrate, immersed in said acid or said water solution of acids, to ultrasonic cleaning.

9. The method according to claim 1, wherein said step of spinning said BIG-grown substrate is carried out at a speed of about 300 r.p.m. for about one minute.

* * * * *